United States Patent [19]

Abraham et al.

[11] Patent Number: 5,883,007
[45] Date of Patent: Mar. 16, 1999

[54] METHODS AND APPARATUSES FOR IMPROVING PHOTORESIST SELECTIVITY AND REDUCING ETCH RATE LOADING

[75] Inventors: Susan C. Abraham, San Jose; Gregory J. Goldspring, Alameda, both of Calif.

[73] Assignee: Lam Research Corporation, Fremont, Calif.

[21] Appl. No.: 770,336

[22] Filed: Dec. 20, 1996

[51] Int. Cl.$^6$ ................................................ H01L 21/302
[52] U.S. Cl. .................... 438/714; 438/738; 438/742; 438/952
[58] Field of Search ................... 438/714, 720, 438/738, 742, 952

[56] References Cited

U.S. PATENT DOCUMENTS

| | | | |
|---|---|---|---|
| 4,267,012 | 5/1981 | Pierce et al. | 156/643 |
| 4,412,885 | 11/1983 | Wang et al. | 156/643 |
| 4,614,021 | 9/1986 | Hulseweh | 29/590 |
| 4,740,485 | 4/1988 | Sharpe-Geisler | 437/246 |
| 4,820,611 | 4/1989 | Arnold, III et al. | 430/271 |
| 4,878,994 | 11/1989 | Jucka et al. | 156/643 |
| 4,980,018 | 12/1990 | Mu et al. | 156/643 |
| 5,225,040 | 7/1993 | Rohner | 156/652 |
| 5,238,872 | 8/1993 | Thalapaneni | 437/190 |
| 5,256,245 | 10/1993 | Keller et al. | 156/643 |
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,387,556 | 2/1995 | Ma et al. | 437/228 |
| 5,411,631 | 5/1995 | Hori et al. | 216/72 |
| 5,429,070 | 7/1995 | Campbell et al. | 118/723 |
| 5,496,762 | 3/1996 | Sandhu et al. | 437/60 |
| 5,522,520 | 6/1996 | Kawamoto | 216/62 |
| 5,540,812 | 7/1996 | Kadomura | 156/652.1 |
| 5,545,289 | 8/1996 | Chen et al. | 156/643.1 |
| 5,562,801 | 10/1996 | Nulty | 156/643.1 |
| 5,609,775 | 3/1997 | Liu | 216/77 |
| 5,620,615 | 4/1997 | Keller | 438/720 |
| 5,665,641 | 9/1997 | Shen et al. | 438/643 |
| 5,766,974 | 6/1998 | Sardella et al. | 437/195 |
| 5,772,906 | 6/1998 | Abraham | 216/72 |
| 5,795,829 | 8/1998 | Shen | 438/694 |

FOREIGN PATENT DOCUMENTS

| | | | |
|---|---|---|---|
| 489 407 A2 | 6/1992 | European Pat. Off. | H01L 37/32 |
| 622 477 A1 | 11/1994 | European Pat. Off. | C23F 4/00 |
| 0637067 A | 2/1995 | European Pat. Off. | |
| 3842758 | 6/1990 | Germany | H01L 21/90 |
| 07074156 | 3/1995 | Japan . | |
| WO 9730472 | 8/1997 | WIPO . | |

OTHER PUBLICATIONS

Riley, P.E. et al "Plasma Etching of Aluminum for ULSI Circuits" Solid State Tech. 36 (2) 47–55, Feb. 1993.

Kulkarni et al "Patterning of Submicron Metal Features and Pillars in Multilevel Metallization" J. Electrochem. Soc.: Solid–State Sci. Tech. 135 (12) 3094–3098, Dec. 1988.

Youn J. et al., "Effects of Process Parameters on Microloading in Sub–halfmicron Aluminum Etching," Proceedings of the Spie–Int. Soc. for Optical Engineering, USA, XP–002062782, vol. 2875, pp. 312–321, Oct. 1996.

(List continued on next page.)

*Primary Examiner*—Bruce Breneman
*Assistant Examiner*—Anita Alanko
*Attorney, Agent, or Firm*—Hickman & Martine, LLP

[57] ABSTRACT

Disclosed is an inventive multiple-chemistry etching method suited for etching through selected portions of layers in a layer stack in a plasma processing chamber. The layer stack preferably includes at least an anti-reflective layer and a metallization layer disposed below the anti-reflective layer. The method includes a first etching step where the antireflective layer of the layer stack is at least partially etched with a first chemistry, the first chemistry comprising an etchant chemical and a polymer-forming chemical. Once the first etching step is complete, the method proceeds to a second etching step where at least part of the metallization layer of the layer stack is etched with a second chemistry different from the first chemistry.

14 Claims, 4 Drawing Sheets

OTHER PUBLICATIONS

Gabriel C.T. et al., "Minimizing metal etch rate pattern sensitivity in a high density plasma etcher," Journal of Vacuum Science & Technology, May/Jun. 1997, XP–002062781, pp. 697–701.

Abraham S.C. et al., "Performance of different etch chemistries on titanium nitride anti reflective coating layers and related selectivity and microloading improvements for submicron geometries obtained with a high–density metal etcher," Journal of Vacuum Science & Technology, May/Jun. 1997, XP–002062780, pp. 702–706.

Patent Abstracts of Japan, vol. 95, No. 6, Jul. 31, 1995 JP 07–074,156.

Riley, P; Holbert, R; Kavari, R; and Lujan, L., "Composite metal etching for submicron integrated circuits" Extented Abstracts, vol. 93, No. 1, May 1993, Princeton, NJ.

Riley, P; Peng, S; and Fang, L., "Plasma Etching of Aluminum for ULSI Circuits", Solid State Technology, vol. 36, No. 2, Feb. 1993, Washington.

Gottscho, R.S; Jurgensen, C.W; Vitkavage, D.J., "Microscopic Uniformity in Plasma Etching", Journal of Vacuum Science and Technology B, Microelectronic Process and Phenomomena, vol. 10, No. 5, Oct. 1992, pp. 2133–2147.

T. H. Ahn, S.W. Nam, K.J. Min, and C. Chung, *"Effect of Residual Gases on Residue Formation during Tungsten/TiN/ Ti Etching Using $SF_6$ and $Cl_2$ Gas Chemistry,"* Jpn. J. Appl. Phys. vol. 33 (1994) pp. L918–L920, Part 2, No. 7A, Jul. 1, 1994.

METHODS AND APPARATUSES FOR IMPROVING PHOTORESIST SELECTIVITY AND REDUCING ETCH RATE LOADING

BACKGROUND OF THE INVENTION

The present invention relates to the fabrication of semiconductor integrated circuits (IC's). More particularly, the present invention relates to methods and apparatuses for etching through an IC's layer stack that includes at least one metallization layer.

Figure 1:
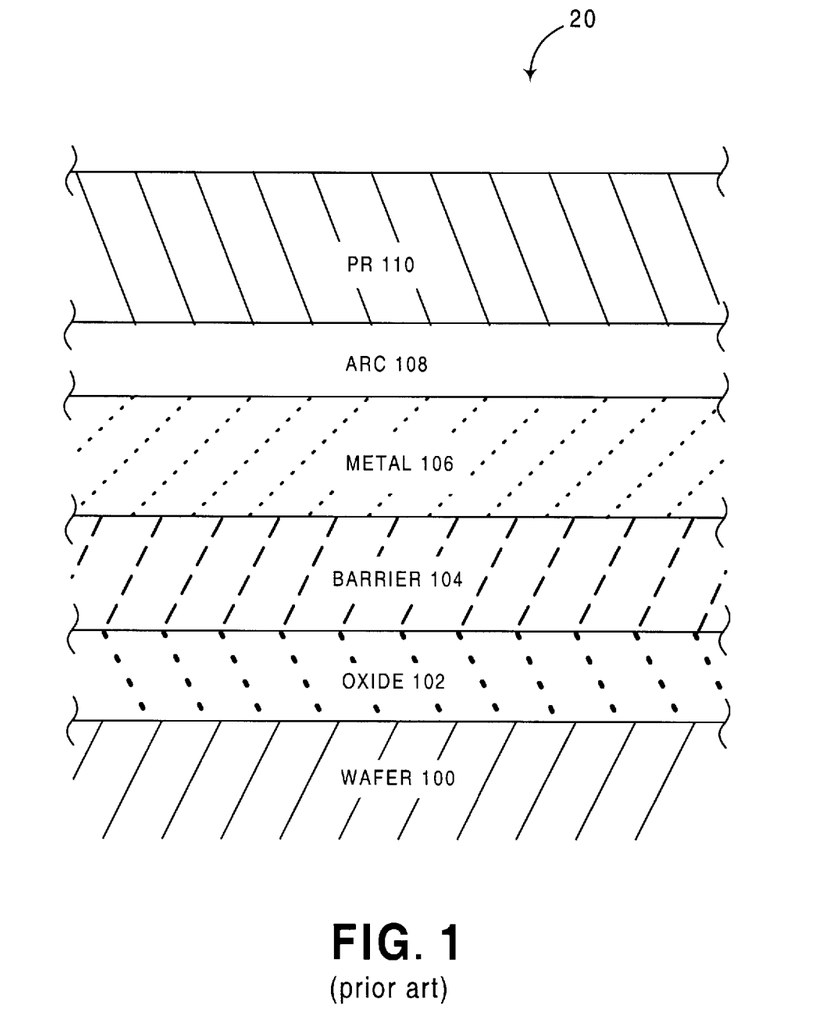
FIG. 1 illustrates a cross-section view of a layer stack, representing the layers formed during the fabrication of a typical semiconductor IC.

In semiconductor IC fabrication, devices such as component transistors are formed on a semiconductor wafer or substrate, which is typically made of silicon. Metallic interconnect lines, which are etched from a metallization layer disposed above the wafer, are then employed to couple the devices together to form a desired circuit. To facilitate discussion, FIG. 1 illustrates a cross-section view of a layer stack 20, representing the layers formed during the fabrication of a typical semiconductor IC. It should be noted that other additional layers above, below, or between the layers shown may be present. Further, not all of the illustrated layers need necessarily be present and some or all may be substituted by a variety of different layers.

At the bottom of layer stack 20, there is shown a wafer 100. An oxide layer 102 which is typically a silicon dioxide ($SiO_2$) is shown formed over the surface of wafer 100. A barrier layer 104, typically formed of Ti, TiW, TiN or other suitable barrier materials, may be disposed between oxide layer 102 and a subsequently deposited metallization layer 106. Barrier layer 104, when provided, functions to substantially prevent diffusion of silicon atoms from oxide layer 102 and into the metallization layer.

Metallization layer 106 typically includes aluminum, copper or one or more of a variety of known aluminum alloys such as Al-Cu, Al-Si, and Al-Cu-Si. The remaining two layers of FIG. 1 include an anti-reflective coating (ARC) layer 108 that is formed over metallization layer 106, and an overlaying photoresist (PR) layer 110 formed over ARC layer 108. As is well known in the art, ARC layer 108 is typically composed of Ti, TiN or TiW. Generally speaking, ARC layer 108 is useful in preventing light used in photolithography processes from reflecting and scattering off of the metallization layer 106 surface, and may, in some cases, inhibit hillock growth.

As mentioned above, photoresist layer 110 represents a layer of conventional resist material that may be patterned using patterned reticles and a stepper that passes ultra-violet rays onto the surface of photoresist layer 110. The layers of layer stack 20 are readily recognizable to those skilled in the art and may be formed using any number of known deposition processes, including chemical vapor deposition (CVD), plasma-enhanced chemical vapor deposition (PECVD), and physical vapor deposition (PVD) such as sputtering.

To create the aforementioned metallic interconnect lines, the PR layer 110 is patterned with a suitable photolithography technique, and subsequently the exposed metal film(s) are etched. By way of example, one such photolithography technique involves the patterning of photoresist layer 110 by exposing the photoresist material in a contact or stepper photolithography apparatus, and the development of the photoresist material to form a patterned mask that exposes certain portions of the underlying metallization layer 108. In this manner, subsequent etchants may be used to etch away portions of the underlying metallization layers that are not covered by the remaining photoresist mask. Accordingly, the remaining metallization material will form a plurality of interconnect lines that are consistent with a selected functional circuit pattern.

Figure 2:
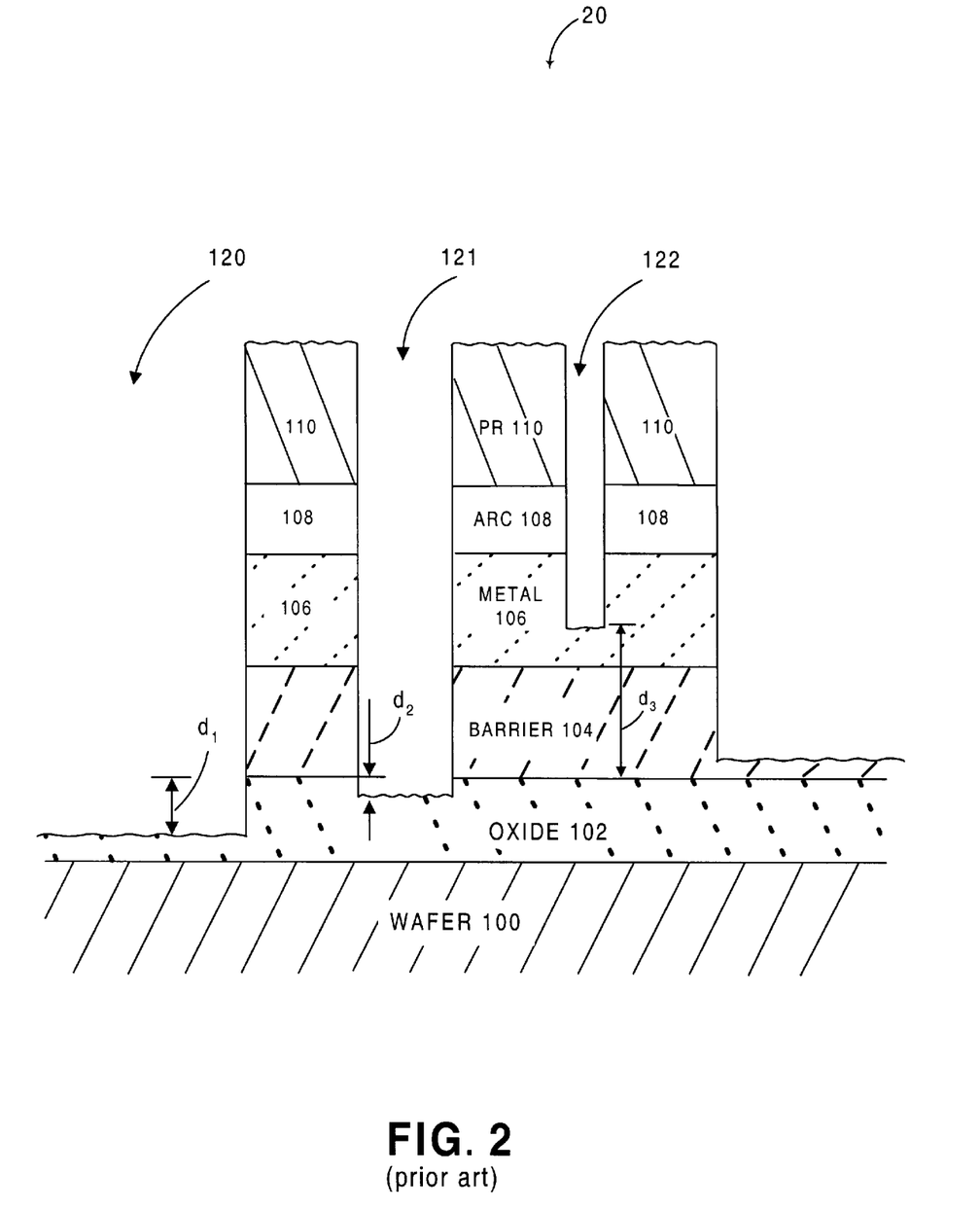
FIG. 2 illustrates a cross-section view of the layer stack of FIG. 1 after conventional etching is completed.

For illustration purposes, FIG. 2 shows a cross-section view of layer stack 20 of FIG. 1 after conventional etching is completed. In this example, the metallic interconnect lines are represented by the unetched portions of metallization layer 106. To achieve greater circuit density, modern IC circuits are scaled with increasingly narrower design rules. As a result, the feature sizes, i.e., the width of the interconnect lines and spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's generally employ interconnect lines that are about 0.25 microns wide, or even thinner.

As feature sizes continue to shrink, it has become increasingly difficult to achieve a uniform etch rate across the surface of a selected wafer. Typically, the etch rate in narrow spacings is slower than that in the wider, open field regions. This phenomenon is referred to as "etch rate loading," and is believed to be a consequence of "microloading" and "aspect ratio dependent etching" (ARDE). Mircroloading refers primarily to a situation wherein the etch rate is less in areas where there is a high density of line spacings relative to the etch rate of identically sized trenches located in a less dense area.

ARDE, on the other hand, refers to the variation in the etch rate uniformity due to the variations in the height of the photoresist layer divided by a width of a selected trench (i.e., aspect ratio≈height/width). A variety of techniques may be used to reduce ARDE which may include decreasing the height of the photoresist masking layer or other masking materials. Unfortunately, when the height of the photoresist masking layer is decreased, many commonly used etching chemistries rapidly etch through this masking layer leaving sensitive underlying layers regions exposed for inadvertent etching. Further, the ARDE problem tends to be even more prominent when trench width dimensions are decreased.

As a result of these etch rate variations, by the time metal etching is complete in areas having a slow etch rate (e.g., narrower space regions), overetching, i.e., the inadvertent removal of materials from underlying layers, may have already occurred in areas having a higher etch rate (e.g., open field regions).

With reference to FIG. 2, area 120 represents an open field region where the metallization layer is extensively overetched (by distance d1), area 121 represents an overetched region (by distance d2), and area 122 represents an underetched area where the metallization is extensively underetched (by distance d3). If the etch rate variations are sufficiently large, certain semiconductor devices may not be etched to target layers without destroying sensitive layers with extensive overetching. By way of example, the metal layer in area 122 will not be sufficiently etched before layers in the open field regions 120 are damaged. Thus, large etch rate variations may cause undue overetching and excessive oxide loss in area 120, rendering the wafer undergoing processing unsuitable for use in further IC fabrication.

In view of the foregoing, what is needed are improved methods and apparatuses for reducing etch rate loading when the etching layer stack. Further, there is a need for methods and apparatuses that allow for the reduction of photoresist aspect ratios through the use of etching chemistries that are highly selective to photoresist.

SUMMARY OF THE INVENTION

The present invention fills these needs by providing an inventive multiple-chemistry etching method. In one embodiment, a plasma processing chamber is used for etching through selected portions of layers in a layer stack. The layer stack preferably includes at least an anti-reflective layer and a metallization layer disposed below the anti-reflective layer. The method includes a first etching step where the anti-reflective layer of the layer stack is at least partially etched with a first chemistry, the first chemistry comprising an etchant chemical and a polymer-forming chemical. Once the first etching step is complete, the method proceeds to a second etching step where at least part of the metallization layer of the layer stack is etched with a second chemistry different from the first chemistry. In one embodiment, a third chemistry may be implemented to efficiently etch through a barrier layer that may be underlying the metallization layer. Advantageously, the first and second chemistries provide an improved photoresist selectivity.

In another embodiment, an integrated circuit formed in a plasma processing chamber is disclosed. In this embodiment, the plasma processing chamber implements a photoresist selective multiple-chemistry etchant for etching layers of a layer stack. The layer stack may have a metallization-overlaying layer and a metallization layer disposed below the metallization-overlaying layer. The integrated circuit includes a low aspect ratio photoresist layer that is a top layer of the layer stack. The low aspect ratio photoresist layer is patterned to have a first plurality of regions that expose the metallization-overlaying layer and a second plurality of regions that protect the metallization-overlaying layer. The integrated circuit further includes a metallization-overlaying layer that is etched substantially down to the metallization layer with a first chemistry, and the metallization-overlaying layer being etched through the first plurality of regions that expose the metallization-overlaying layer of the layer stack. Preferably, the first chemistry comprising an etchant chemical and a polymer-forming chemical. The integrated circuit also includes a metallization layer that is etched with a second chemistry through the first plurality of regions that expose the metallization layer of the layer stack. In this embodiment, the second chemistry being different from the first chemistry.

In yet another embodiment, the invention relates to a method for performing a photoresist selective etch through a selected portion of layers of a layer stack, the layer stack comprising a TiN layer and an aluminum/copper layer. The method comprises etching at least partially through the TiN layer of the layer stack with a first chemistry. The first chemistry being selected from the group consisting of: (1) a first mixture of $Cl_2$, Ar and $CHF_3$; (2) a second mixture of $Cl_2$, $CHF_3$ and $BCl_3$; and (3) a third mixture of $Cl_2$, $N_2$, and $CHF_3$. The method further includes etching at least partially through the aluminum/copper layer of the layer stack with a second chemistry, the second chemistry is selected from the group consisting of: (1) a fourth mixture of $Cl_2$, $N_2$ and HCl; and (2) a fifth mixture of $Cl_2$, $CHF_3$ and $BCl_3$.

Advantageously, the substantially improved photoresist selectivity of this invention enables the application of substantially thinner photoresist masks. As a result, the aspect ratio of the photoresist mask is reduced and the etch rate loading is also substantially reduced. These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is described for minimizing etch rate loading problems while achieving commercially advantageous etch rates and selectivities. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the aforementioned etch rate loading problem is substantially avoided by etching the layer stack in at least two steps and implementing at least two different chemistries. This first chemistry etching step preferably proceeds at least through the ARC layer, e.g., ARC layer 108 of FIG. 1. In addition to the main etchant gas that is employed to etch through part of the aforementioned ARC layer, the first chemistry preferably includes a polymer-forming gas and may or may not include an inert gas. Thereafter, the layer stack is etched again, albeit with a second chemistry that may be different from the first chemistry. This second chemistry etching step is then preferably allowed to proceed at least partially through the metallization layer, e.g., layer 106 of FIG. 1. If barrier layer 104 of the layer stack requires etching, a third etching step may be implemented using a third chemistry that is, in one embodiment, substantially the same as the first chemistry. Of course, it should be appreciated that the second chemistry may be used to etch through the barrier layer.

The inventive multiple-chemistry etch process may be performed in any of the known plasma processing apparatuses, including those adapted for dry etching, plasma etching, reactive ion etching (RIE), magnetically enhanced reactive ion etching (MERIE), or the like. To further elaborate, in a typical plasma processing chamber adapted for dry etching, the wafer is treated with plasma. The chamber includes an inlet port through which process etchant source gases are supplied to the chamber interior. A suitable RF energy source, e.g., an RF energy source, is applied to electrodes associated with the chamber to induce plasma. The energy itself may be coupled inductively or capacitively to sustain the plasma, as is known. Species are then formed from the etchant source gas to react with the wafer and etch away at the plasma-contacting layer of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective whether energy to the plasma is delivered through capacitively coupled parallel electrode plates, through electron cyclotron resonance (ECR) microwave plasma sources, through inductively coupled RF sources such as helicon, helical resonators, and transformer coupled plasma (TCP). ECR and TCP plasma processing systems, among others, are available from Lam Research Corporation of Fremont, Calif.

Figure 3:
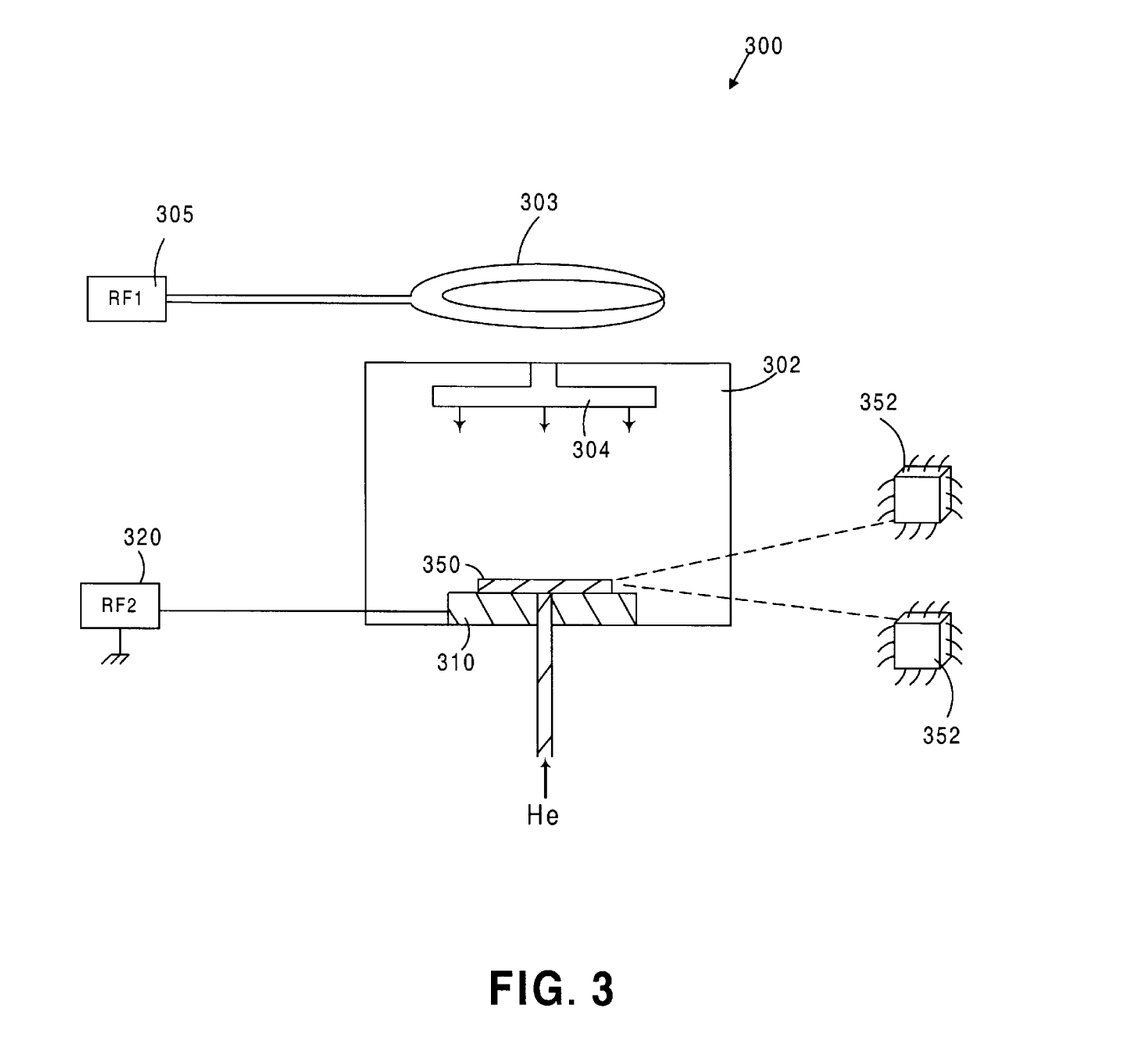
FIG. 3 is a simplified schematic diagram of a plasma reactor that may be suitably employed with the inventive multiple-chemistry etch technique.

In a preferred embodiment, the present invention is employed in a TCP™ 9600 SE plasma reactor, which is available from Lam Research Corporation, although, as mentioned above, any other conventional and suitable plasma processing systems may well be employed. FIG. 3 illustrates a simplified schematic of the TCP™ 9600 SE plasma reactor, including wafer 350 and integrated circuit chips 352, which are fabricated from dies cut from wafer 350 after the wafer is etched according to the inventive etch and processed in conventional post-etch steps. Referring to FIG. 3, a wafer reactor 300 includes a plasma processing chamber 302. Above chamber 302, there is disposed an electrode 303, which is implemented by a coil in the example of FIG. 3. Coil 303 is energized by a RF generator 305 via a matching network (not hown in FIG. 3).

Within chamber 302, there is provided a shower head 304, which preferably includes a plurality of holes for releasing gaseous source materials, e.g., the etchant source gases, into the RF-induced plasma region between itself and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator 320 (also typically via a matching network).

Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept, e.g., between about 0.5 mTorr and about 200 mTorr in one embodiment. A plurality of heaters (omitted from FIG. 3 to simplify the illustration) may be provided to maintain a suitable chamber temperature for etching (e.g., about 50° C. in one embodiment). To provide a path to ground, the chamber wall of chamber 302 is typically grounded.

Figure 4:
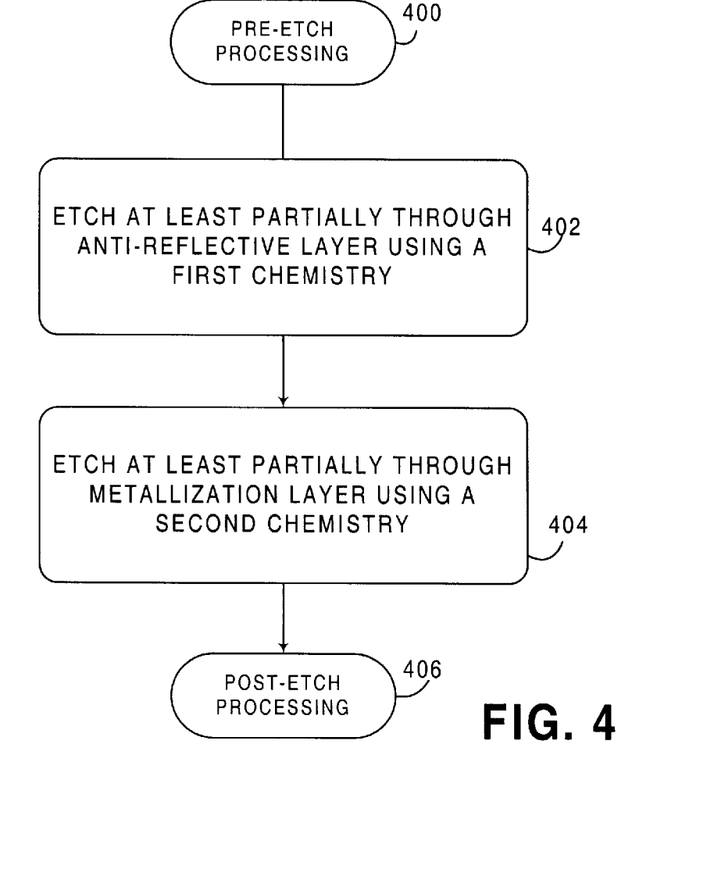
FIG. 4 shows, in accordance with one aspect of the present invention, the steps involved in the inventive multiple-chemistry etch technique.

FIG. 4 shows, in accordance with one aspect of the present invention, the steps involved in the inventive multiple-chemistry etch process. In step 400, the wafer is prepared for etching in a conventional pre-etch step. The pre-etch step may include, for example, clamping the wafer onto chuck, stabilizing the pressure within the plasma processing chamber, and introducing helium cooling gas to the wafer backside to facilitate heat transfer between the wafer and the chuck.

In step 402, the anti-reflective layer of the layer stack is etched with a first chemistry. It should be borne in mind that although this embodiment and the remainder of the disclosure contemplates the anti-reflective layer being the layer that undergoes etching with the first chemistry, this first chemistry etching may also be performed, in certain layer stack structures, on any metallization-overlaying layer, e.g., adhesion layer, seed layer, or the like. As the term is employed herein, a metallization-overlaying layer represents a layer that is disposed above the metallization layer.

Further, this overlaying layer may be formed either of Ti, TiN, TiW or a material that is mainly titanium. In accordance with this embodiment, etching with the first chemistry preferably terminates when it is determined that the anti-reflective layer is etched through. In one embodiment, the anti-reflective layer is formed of TiN, and endpoint detection is accomplished by optically monitoring the change of the 703 nm wavelength in the plasma, which indicates that substantially all the TiN anti-reflective layer has been removed. Etching may then terminate immediately or may be allowed to continue for a predetermined period of time, e.g., an additional five seconds, to ensure the complete removal of the TiN anti-reflective layer material. Other conventional methods to determine the termination point for this first chemistry etch step may also be employed.

In accordance with one aspect of the present invention, the first chemistry for a TiN anti-reflective layer etch may include any one of the group consisting of $Cl_2/Ar/CHF_3$, $Cl_2/CHF_3/BCl_3$, $Cl_2/CHF_3$, $Cl_2/N_2$, $Cl_2/N_2/CHF_3$, $Cl_2/HCl/CHF_3$, and $Cl_2/N_2/BCl_3$. More preferably, the first chemistry may include any one of the group consisting of $Cl_2/Ar/CHF_3$ and $Cl_2/CHF_3/BCl_3$. Most preferably, the first chemistry for a TiN anti-reflective layer etch is $Cl_2/Ar/CHF_3$. It is contemplated that the argon in the $Cl_2/Ar/CHF_3$ may be substituted by other noble gases such as helium, krypton, xenon, or the like.

$Cl_2/Ar/CHF_3$ also provides other advantageous results, which are discussed in greater detail in a co-pending, commonly assigned patent applications entitled: (1) "Methods and Apparatus for Etching Semiconductor Wafers," U.S. patent Ser. No. 08/602,251; (2) "Methods and Apparatus for Reducing Etch Rate Loading," U.S. patent Ser. No. 08/601,708; (3) "Mechanism For Uniform Etching by Minimizing Effects of Etch Rate Loading," U.S. patent Ser. No. 08/652,718 now U.S. Pat. No. 5,772,906; and (4) "Methods and Apparatus for Etching Semiconductor Wafers and Layers Thereof," U.S. patent Ser. No. 08/678,034 now U.S. Pat. No. 5,846,443. All above listed U.S. patent applications are hereby incorporated by reference.

As mentioned earlier, the first chemistry preferably includes a polymer-forming chemical (e.g., $N_2$, $CHF_3$, or the like) in addition to the chemical that is mainly responsible for etching (e.g., $Cl_2$). In this manner, the first chemistry etches away the overlaying layer (e.g., the TiN ARC layer) while simultaneously depositing a polymer on the overlaying layer. It is believed that the use of a polymer-forming agent in the first chemistry micromasks the wider spacings, i.e., causing masking polymers to be deposited in the wider spacings at a faster rate than in the narrower spacings. Due to the micromasking phenomenon, the etch rate in the wider spacings are substantially slowed, thereby reducing the difference between the etch rate in the wider spacings and that in the narrower spacings.

In one embodiment, the flow volume in standard cubic centimeters per minute (sccm) of the polymer-forming agent (e.g., $CHF_3$) is between about 3% and about 40% of the overall flow of $Cl_2$ in sccm, and more preferably between about 5% and about 35% of the overall flow of $Cl_2$ in sccm, and most preferably about 17.5% of the overall flow of $Cl_2$ in sccm. It should be understood that a selected etch rate may be adjusted by appropriately modifying the flow volume ratio of the polymer-forming agent. By way of example, increasing the ratio of the flow volume of the polymer-forming agent tends to reduce the etch rate in the open areas due to the increase in polymer deposition during etching.

In step 404, the remainder of the layer stack is etched down at least partially through the metallization layer with a second chemistry. For example, the second chemistry may be employed to etch through most of the metallization layer, with the remainder and/or the barrier layer underneath being etched with a third chemistry. In this embodiment, the second chemistry etching step proceeds until the metallization layer has been substantially etched away. Once the metallization layer has been substantially etched away, the third chemistry may be implemented to efficiently etch through the underlying barrier layer.

The second chemistry is preferably different from the first chemistry because if a polymer creating gas is employed for the bulk etch, e.g., through the aluminum metallization layer, it could result in residues due to micromasking and may also lower the photoresist selectivity. Accordingly, the use of novel first chemistries (to etch through the ARC layer) that are different from a second chemistry represents a significant feature of the present invention.

The second chemistry itself may include any suitable etchant and bombardment chemicals for etching through the metallization layer. In one embodiment, the second chemistry is any one of the group comprising $Cl_2/N_2/HCl$, $Cl_2/N_2$, $Cl_2/BCl_3/CHF_3$, $Cl_2/BCl_3/HCl$, and $Cl_2/BCl_3/N_2$. By way of example, a mixture of $Cl_2/N_2/HCl$ having a flow volume ratio of about 85:30:25 (in sccm) has been found to be especially well suited for etching through a metallization layer which comprises an alloy of aluminum having about 0.5%–1% copper.

For example, the above described approach is believed to produce a superior TiN ARC layer to photoresist selectivity of about 3:1 due to the first chemistry's exceptional ability to etch TiN ARC layer materials. That is, the TiN ARC layer may be etched away three times faster than the photoresist material. This is a significant result when compared to a prior art "one-chemistry" approach where $Cl_2/N_2/HCl$ is used to etch through both the TiN ARC layer and the underlying metallization layer. This prior art one-chemistry approach generally produces a very poor TiN ARC layer to photoresist selectivity ratio of about 0.7:1 due to the $Cl_2/N_2/HCl$ chemistry's inferior etching performance on TiN ARC layer materials. By way of example, in order to etch 0.7 microns of TiN ARC material, 1 micron of photoresist would also be disadvantageously etched away. As can be appreciated, the substantially improved photoresist selectivity of this invention enables the application of substantially thinner photoresist masks.

As a further comparison, when the one-chemistry etchant $Cl_2/N_2/HCl$ was used to etch $0.35\mu$ spacings and feature sizes, a deep ultraviolet (DUV) photoresist was applied to a thickness of about 9,500 Å throughout the wafer surface. After etching was completed down through both the TiN ARC layer and the aluminum metallization layer, the remaining photoresist was found to be about 3,450 Å at the center of the wafer and about 3,200 Å at the edges.

As a surprising and unexpected result, when the inventive multiple-chemistry process was used to etch identical spacings sizes, features sizes and DUV photoresist thicknesses, the center of the wafer retained about 5,350 Å of the original 9,500 Å at about the center of the wafer, and the edge of the wafer retained about 5,600 Å of the original 9,500 Å. As can be appreciated, substantially more resist remained after the multiple-chemistry etch than with prior art etch chemistries. Therefore, the photoresist aspect ratio may be substantially reduced by reducing the thickness of the applied photoresist, which further reduces etch rate loading. Accordingly, using the above parameters, it is now possible to apply substantially thinner DUV photoresist layers having exemplary thicknesses as low as about 4,000 Å, and more preferably as low as about 5,000 Å. Of course, if prior art chemistries were used, the photoresist would have to be applied to much greater thicknesses in order to protect underlying features from over etching.

To further exemplify the advantageous results of the inventive multiple-chemistry approach, yet another prior art one-chemistry $Cl_2/BCl_3$ etching process will be contrasted. By way of example, the etch rate loading produced using this prior art one-chemistry $Cl_2/BCl_3$ etchant for an 8-inch wafer and 0.5 micron geometries has been found to be between about 25%–about 30%. That is, the etch rate in the open field regions is between about 25%–about 30% faster than that in the 0.5 micron spacings. As described with reference to FIG. 2, these high etch rate loading levels are known to cause significant damage through overetching. Under similar process parameters, the etch rate loading achieved for the inventive multiple-chemistry etch that employs, in accordance with one embodiment of the present invention, $Cl_2/Ar/CHF_3$ as the first chemistry and $Cl_2/N_2/HCl$ as a second chemistry, has been found to be as low as about 2%, and more typically as low as about 2.5% throughout the wafer surface.

In addition, the inventive multiple-chemistry approach has also produced up to about a 90% higher photoresist selectivity than that produced using the one-chemistry conventional etchant $BCl_3/Cl_2$. As a result, it is now possible to substantially reduce the thickness of the photoresist which advantageously reduces the photoresist's aspect ratio. Further, when the aspect ratio is reduced, etch rate loading is also reduced.

It is also found that the use of the inventive multiple-chemistry etch results in overall etch rates and TiN-to-aluminum selectivity that are within commercially advantageous ranges. By way of example, the etch rate for the ARC TiN layer for the inventive multiple-chemistry etch in which $Cl_2/Ar/CHF_3$ is employed as the first chemistry is, in one embodiment, about 11,000 (Å) angstroms/minute. The TiN-to-aluminum selectivity for the $Cl_2/Ar/CHF_3$ is, in one embodiment, about 10:1. Further, the composite etch uniformity expressed as a statistical 3x standard distribution (i.e., of both the ARC layer etch and the bulk etch) for the aforementioned inventive chemistries is, in one embodiment, between about 10% and about 15%, and more preferably about 12%.

Etching with the second chemistry may terminate when at least a portion of the metallization layer is etched to an underlying layer. Accordingly, etching with the second chemistry may terminate when it is determined that the metallization layer is substantially etched through. In one embodiment, the metallization layer is formed of aluminum or one of its alloys, and endpoint detection is accomplished by optically monitoring the change of the 261 nm optical wavelength in the plasma, which indicates that substantially all of the aluminum metallization layer has been removed.

Once optical monitoring detects the rise of the 261 nm optical wavelength, etching with the second chemistry may terminate immediately or may be allowed to continue for a predetermined period of time, e.g., a few additional seconds, to ensure complete removal of the metallization layer material.

In step 406, the wafer undergoes additional post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

Figure 5:
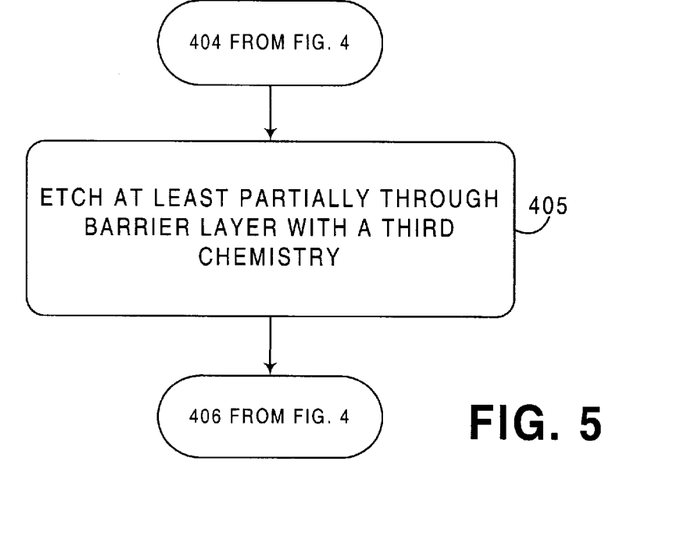
FIG. 5 shows, in accordance with one aspect of the present invention, the step associated with implementing a third chemistry etching step.

FIG. 5 illustrates the process steps associated with etching a barrier layer with a third chemistry in accordance with one embodiment of the present invention. Although the second chemistry may extended to etch through the barrier layer, the third chemistry employed in step 405 may be better suited to etch through the remaining metallization layer and into an underlying layer. As will be described below, the third chemistry may be substantially identical to the first chemistry when the underlying layer is a Ti or TiN barrier layer. That is, the third chemistry is preferably $Cl_2/Ar/CHF_3$. Of course, it is contemplated that the argon in the $Cl_2/Ar/CHF_3$ chemistry may be substituted with other noble gases such as helium, krypton, xenon, and the like.

On the other hand, an alternative third chemistry may be used to etch through the underlying barrier layer. In one embodiment, the alternative third chemistry may preferably be $Cl_2/CHF_3/BCl_3$. The flow rate of $Cl_2$ for this embodiment is preferably about 80 sccm, the flow rate of $CHF_3$ is about 20% of the total $Cl_2$ flow, and the flow rate of $BCl_3$ is about 20% of the total $Cl_2$ flow. The preferable pressure and temperature conditions of this embodiment is about 12 mTorr and about 50° C., respectively. Once the third chemistry is used to etch through the underlying barrier layer, the process will again proceed to step 406 of FIG. 4 where post-etch processing is performed.

For more information, Table 1 below shows the approximate process parameters that may be suitable for the first chemistry etch of an 8 inch wafer in a TCP™ 9600 SE plasma reactor. In this example, the metallization-overlaying layer is a TiN anti-reflection layer, which overlays an aluminum layer containing approximately about 0.5% copper. In these tables, an approximate suitable range, an approximate preferred range, and an approximate more preferred range of the top electrode power (in watts), bottom electrode power (in watts), and flow rates (in percentage of total etchant source flow rate unless otherwise specified) are shown.

Table 1 illustrates the approximate suitable parameters for the $Cl_2/Ar/CHF_3$ first chemistry, and table 2 illustrates the approximate suitable parameters for the $Cl_2/N_2/HCl$ second chemistry, table 3 illustrates the approximate suitable parameters for the $Cl_2/Ar/CHF_3$ third chemistry, and table 4 illustrates the approximate suitable parameters for the $Cl_2/CHF_3/BCl_3$ alternative third chemistry.

Other parameter values that may be helpful for the etch will be readily apparent to those skilled in the art, whether for the same wafer and anti-reflection layer or other wafers and anti-reflection layers. Further, although the following parameters are associated with an exemplary "8 inch wafer," the parameters may be modified for application to substrates of varying sizes and shapes such as those employed in the manufacture of semiconductor devices and flat panel displays. As circuit dimensions continue to shrink, the improved photoresist selectivity of this invention may be particularly suited for fabricating devices having trench and features sizes as small as 1.8 microns and below. As mentioned above, because the improved photoresist selectivity allows for thinner photoresist layers, etch rate loading is also minimized.

TABLE 1

| First Chemistry | Top Power (watts) | Bottom Power (watts) | $Cl_2/Ar/CHF_3$ Flow Rate | | | Pressure | Temp |
|---|---|---|---|---|---|---|---|
| Approximate Range | 0–2000 | 80–1000 | 15 sccm–300 sccm $Cl_2$ | 3%–40% (of $Cl_2$ flow) $CHF_3$ | 10%–60% (of $Cl_2$ flow) Ar | 0.5 mTorr–200 mTorr | −20° C. to 120° C. |
| Approximate Preferred Range | 0–700 | 80–400 | 30 sccm–200 sccm $Cl_2$ | 5%–35% (of $Cl_2$ flow) $CHF_3$ | 20%–50% (of $Cl_2$ flow) Ar | 2 mTorr–80 mTorr | 0° C. to 80° C. |
| Approximate More Preferred Range | 560 | 140 | 80 sccm $Cl_2$ | 17.5% (of $Cl_2$ flow) $CHF_3$ | 37.5% (of $Cl_2$ flow) Ar | 15 mTorr | 50° C. |

TABLE 2

| Second Chemistry | Top Power (watts) | Bottom Power (watts) | $Cl_2/N_2/HCl$ Flow Rate | | | Pressure | Temp |
|---|---|---|---|---|---|---|---|
| Approximate Range | 100–2000 | 80–1000 | 0 sccm–300 sccm $Cl_2$ | 0–50% (of $Cl_2$ flow) $N_2$ | 0–100% (of $Cl_2$ flow) HCl | 0.5 mTorr–200 mTorr | –15° C. to 120° C. |
| Approximate preferred Range | 100–700 | 80–400 | 30 sccm–200 sccm $Cl_2$ | 5%–30% (of $Cl_2$ flow) $N_2$ | 5%–30% (of $Cl_2$ flow) HCl | 2 mTorr–80 mTorr | 20° C. to 80° C. |
| Approximate More Preferred Range | 180 | 220 | 85 sccm $Cl_2$ | 30% $N_2$ flow) | 25% (of $Cl_2$ HCl | 12 mTorr | 50° C. |

TABLE 3

| Third Chemistry | Top Power (watts) | Bottom Power (watts) | $Cl_2/Ar/CHF_3$ Flow Rate | | | Pressure | Temp |
|---|---|---|---|---|---|---|---|
| Approximate Range | 0–2000 | 80–1000 | 15 sccm–300 sccm $Cl_2$ | 3%–40% (of $Cl_2$ flow) $CHF_3$ | 10%–60% (of $Cl_2$ flow) Ar | 0.5 mTorr–200 mTorr | –20° C. to 120° C. |
| Approximate Preferred Range | 0–700 | 80–400 | 30 sccm–200 sccm $Cl_2$ | 5%–35% (of $Cl_2$ flow) $CHF_3$ | 20%–50% (of $Cl_2$ flow) Ar | 2 mTorr–80 mTorr | 0° C. to 80° C. |
| Approximate More Preferred Range | 560 | 140 | 80 sccm $Cl_2$ | 17.5% (of $Cl_2$ flow) $CHF_3$ | 37.5% (of $Cl_2$ flow) Ar | 15 mTorr | 50° C. |

TABLE 4

| Alternative Third Chemistry | Top Power (watts) | Bottom Power (watts) | $Cl_2/CHF_3/BCl_3$ Flow Rate | | | Pressure | Temp |
|---|---|---|---|---|---|---|---|
| Approximate Range | 0–2000 | 80–1000 | $Cl_2$ 15 sccm–300 sccm $CHF_3$ | 0%–30% (of $Cl_2$ flow) | 0%–50% (of $Cl_2$ flow) $BCl_3$ | 0.5 mTorr–200 mTorr | –20° C. to 120° C. |
| Approximate Preferred Range | 0–700 | 80–400 | $Cl_2$ 30 sccm–200 sccm $CHF_3$ | 5%–25% (of $Cl_2$ flow) | 5%–50% (of $Cl_2$ flow) $BCl_3$ | 2 mTorr–80 mTorr | 0° C. to 80° C. |
| Approximate More Preferred Range | 200 | 200 | $Cl_2$ 80 sccm | 20% (of $Cl_2$ flow) $CHF_3$ | 20% (of $Cl_2$ flow) $BCl_3$ | 12 mTorr | 50° C. |

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching through a selected portion of layers of a layer stack, said layer stack comprising an anti-reflective layer and a metallization layer disposed below said anti-reflective layer, said method comprising:

etching at least partially through said anti-reflective layer of said layer stack with a first chemistry, said first chemistry consists essentially of $Cl_2$, $CHF_3$ and one of Ar and $BCl_3$;

etching at least partially through said metallization layer of said layer stack with a second chemistry that consists essentially of $Cl_2$, $N_2$, and HCl; and whereby said first and second chemistries in combination provide an increased photoresist selectivity relative to using said second chemistry alone.

2. The method of claim 1 wherein said anti-reflective layer is selected from the group consisting of Ti and TiN.

3. The method of claim 1 wherein said anti-reflective layer comprises TiN and wherein said first chemistry is employed to etch through said anti-reflective layer.

4. The method of claim 1 wherein said $Cl_2$ has a flow of about 80 sccm and the flow of said Ar is about 14 percent of $Cl_2$ and the flow of said $CHF_3$ is about 30 percent of $Cl_2$.

5. The method of claim 1 wherein said $Cl_2$ has a flow of about 85 sccm, and the flow of said $N_2$ is about 30 percent of $Cl_2$ and the flow of said HCl is about 25 percent of $Cl_2$.

6. The method of claim 1 further comprising a third chemistry for etching through an underlying barrier layer.

7. The method of claim 6 wherein the third chemistry is substantially the same as said first chemistry.

8. The method of claim 6 wherein the third chemistry comprises $Cl_2$, $CHF_3$ and $BCl_3$.

9. The method of claim 6 wherein the first, second and third chemistries are configured to etch substrates into semiconductor devices.

10. In a plasma processing chamber, a method for fabricating a semiconductor device including performing a photoresist selective etch through a selected portion of layers of a layer stack, said layer stack comprising a TiN layer and a metallization layer comprising at least one of aluminum and copper, said method comprising:

etching at least partially through said TiN layer of said layer stack with a first chemistry, said first chemistry is selected from the group consisting of:

a first mixture of $Cl_2$, Ar and $CHF_3$,
   a second mixture of $Cl_2$, $CHF_3$ and $BCl_3$, and
   a third mixture of $Cl_2$, $N_2$, and $CHF_3$; and
   etching at least partially through said metallization layer of said layer stack with a second chemistry, said second chemistry consists essentially of
   a fourth mixture of $Cl_2$, $N_2$ and HCl
   whereby etching said layer stack with said first and second chemistries in successive combination provide an increased photoresist selectivity relative to using said second chemistry alone.

11. The method of claim 10 wherein said TiN layer represents an anti-reflective layer.

12. The method of claim 10 wherein said metallization layer comprises aluminum and copper.

13. The method of claim 10 further comprising a third chemistry for etching at least partially through a barrier layer in said layer stack that is lying substantially under said metallization layer.

14. The method of claim 10, wherein the first and second chemistries are configured to etch said layer stack into a semiconductor device.

* * * * *

UNITED STATES PATENT AND TRADEMARK OFFICE
CERTIFICATE OF CORRECTION

PATENT NO. : 5,883,007
DATED : March 16, 1999
INVENTOR(S) : Susan C. Abraham, Gregory J. Goldspring It is certified that error appears in the above-identified patent and that said Letters Patent is hereby corrected as shown below:

Title page,
Section 21, reads: "Appl. No.: 770,336" it should read -- Appl. No.: 08/770,336 --;

Item [56], References Cited, Other Publications add: -- T.H.Ahn, S.W. Nam, K.J. Min, and C. Chung, "Effects of Residual Gases on Residue Formation during Tungsten/TiN/ Ti Etching Using $SF_6$ and $Cl_2$ Gas Chemistry," Jpn. J. Appl. Phys. Vol. 33 (1994) pp. L918-920, Part 2, No. 7A, July 1, 1994 --;

Item [56], References Cited, Other Publications add:-- Riley, P; Holbert, R.; Kavari, R.; and Lujan, L., "Composite metal etching for submicron integrated circuits" Extended Abstracts, vol. 93, no. 1, May 1993, Princeton, NJ --;

Item [56], References Cited, Other Publications add: -- Gottscho, R. S.; Jurgensen, C.W.; Vitkavage, D. J.,"Microscopic Uniformity in Plasma Etching", Journal of Vacuum Science and Technology B, Microelectronic Process and Phenomena, vol. 10, no.5, 10/92. pp 2133-2147 --;

Item [56], References Cited, Other Publications add: -- Gabriel C.T. et al., "Minimizing metal etch rate pattern sensitivity in high density plasma etcher," JOURNAL OF VACUUM SCIENCE & TECHNOLOGY, May/June 1997, XP-002062781, pp. 697-701 --;

Item [56], References Cited, Other Publications add: -- Abraham S. C. et al., "Perfromance of different etch chemistries on titanium nitride anti reflective coating layers and related selectivity and microloading improvements for submicron geometries obtained with a high-density metal etcher," JOURNAL OF VACUUM SCIENCE & TECHNOLOGY, May/June 1997, XP-00206278, pp. 702-706 --;

UNITED STATES PATENT AND TRADEMARK OFFICE
CERTIFICATE OF CORRECTION

PATENT NO.  : 5,883,007
DATED       : March 16, 1999
INVENTOR(S) : Susan C. Abraham, Gregory J. Goldspring It is certified that error appears in the above-identified patent and that said Letters Patent is hereby corrected as shown below:

Column 5,
Line 41, reads" "305 via a matching network (not shown in FIG. 3)", it should read:
-- 305 via a matching network (not shown in FIG. 3). --.

Table 2,
The Flow Rate for the Approximate More Preferred Ranges reads: "85sccm $Cl_2$ 30% $N_2$ flow) 25% (of $Cl_2$ HCl" it should read :-- 85 sccm Cl2 30% flow) N2 25% (of Cl2 flow) HCl --; and Table 2,
Under the Flow Rate for the Approximate More Preferred Range, reads: "25% (of Cl2 HCl" it should read: -- 25% (of Cl2 flow) HCl --.

Signed and Sealed this

Nineteenth Day of February, 2002

*Attest:*

*Attesting Officer*

JAMES E. ROGAN
*Director of the United States Patent and Trademark Office*